(12) United States Patent
Shin et al.

(10) Patent No.: US 12,469,719 B2
(45) Date of Patent: Nov. 11, 2025

(54) SUBSTRATE PROCESSING APPARATUS AND METHOD

(71) Applicant: SEMES CO., LTD., Chungcheongnam-do (KR)

(72) Inventors: Jae Yoon Shin, Chungcheongnam-do (KR); Kee Woong Kim, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 646 days.

(21) Appl. No.: 17/864,613

(22) Filed: Jul. 14, 2022

(65) Prior Publication Data

US 2023/0063546 A1 Mar. 2, 2023

(30) Foreign Application Priority Data

Aug. 24, 2021 (KR) .......................... 10-2021-0111466

(51) Int. Cl.
*H01L 21/67* (2006.01)

(52) U.S. Cl.
CPC .. *H01L 21/67023* (2013.01); *H01L 21/67173* (2013.01)

(58) Field of Classification Search
None
See application file for complete search history.

(56) References Cited

U.S. PATENT DOCUMENTS

| 9,773,687 B2 | 9/2017 | Wakiyama et al. |
| 10,297,473 B2 | 5/2019 | Wakiyama et al. |
| 2018/0158700 A1* | 6/2018 | Shomori ............... H01L 22/26 |

FOREIGN PATENT DOCUMENTS

| JP | 2001-156035 | 6/2001 |
| JP | 2003-305414 | 10/2003 |
| JP | 2009-172520 | 8/2009 |

(Continued)

OTHER PUBLICATIONS

KR 20090023057 A machine translation, Substrate processing apparatus, Jodai (Year: 2009).*

(Continued)

*Primary Examiner* — Cristi J Tate-Sims
(74) *Attorney, Agent, or Firm* — WOMBLE BOND DICKINSON (US) LLP

(57) ABSTRACT

A substrate processing apparatus capable of minimizing process defects by controlling mist in a processing bath is provided. The substrate treating apparatus comprises a first processing bath and a second processing bath disposed adjacent to each other in a first direction, a first partition wall disposed between the first processing bath and the second processing bath and having an entrance, through which a substrate passes, a transfer unit installed in the first processing bath and the second processing bath and for moving the substrate, a chemical solution supply unit installed in the first processing bath and for providing a chemical solution to the substrate, and a first exhaust unit disposed between the first processing bath and the second processing bath, connected to the first partition wall, comprising a plurality of exhaust holes disposed along a second direction different from the first direction, and for exhausting mist in the first processing bath.

19 Claims, 11 Drawing Sheets

(56) References Cited

FOREIGN PATENT DOCUMENTS

| JP | 2015-149383 | 8/2015 |
|---|---|---|
| KR | 10-2005-0073420 | 7/2005 |
| KR | 10-2006-0069033 | 6/2006 |
| KR | 10-2009-0023057 | 3/2009 |
| KR | 10-2009-0032300 | 4/2009 |
| KR | 10-2009-0084650 | 8/2009 |
| KR | 10-2012-0088952 | 8/2012 |
| KR | 10-2015-0035392 | 4/2015 |
| KR | 10-2018-0110852 | 10/2018 |

OTHER PUBLICATIONS

Office Action dated Apr. 25, 2023 for Korean Patent Application No. 10-2021-0111466 and its English translation provided by Global Dossier.
Office Action dated Aug. 1, 2023 for Japanese Patent Application No. 2022-113748 and its English translation provided by Global Dossier.
Notice of Allowance dated Sep. 25, 2023 for Korean Patent Application No. 10-2021-0111466 and its English translation provided by Global Dossier.
Office Action dated Feb. 17, 2025 for Korean Patent Application No. 10-2023-0188873 and its English translation by Google Translate.

* cited by examiner

SUBSTRATE PROCESSING APPARATUS AND METHOD

This application claims the benefit of Korean Patent Application No. 10-2021-0111466, filed on Aug. 24, 2021, in the Korean Intellectual Property Office, the disclosure of which is incorporated herein by reference in its entirety.

BACKGROUND

1. Field

The present invention relates to a substrate processing apparatus and method.

2. Description of the Related Art

A substrate processing apparatus is an apparatus for processing a wafer or a substrate for a display. For example, an apparatus for processing a substrate for a display includes a plurality of processing baths disposed adjacently in sequence. As the display substrate passes through a plurality of processing baths, various chemical solutions such as a cleaning solution, an etchant, and a developer may be sprayed onto the display substrate.

SUMMARY

On the other hand, an exhaust system for exhausting the sprayed chemical solution to the outside is applied to the processing bath. If the exhaust system is not optimized, the sprayed chemical solution may move around in the form of mist in the processing bath, and the chemical solution in the form of mist may be resettled on the display substrate, which may cause process defects.

An object of the present invention is to provide a substrate processing apparatus capable of minimizing process defects by controlling mist in a processing bath.

Another object of the present invention is to provide a substrate processing method capable of minimizing process defects by controlling mist in a processing bath.

The objects of the present invention are not limited to the objects mentioned above, and other objects not mentioned will be clearly understood by those skilled in the art from the following description.

One aspect of the substrate processing apparatus of the present invention for achieving the above technical object comprises a first processing bath and a second processing bath disposed adjacent to each other in a first direction; a first partition wall disposed between the first processing bath and the second processing bath and having an entrance, through which a substrate passes; a transfer unit installed in the first processing bath and the second processing bath and for moving the substrate; a chemical solution supply unit installed in the first processing bath and for providing a chemical solution to the substrate; and a first exhaust unit disposed between the first processing bath and the second processing bath, connected to the first partition wall, comprising a plurality of exhaust holes disposed along a second direction different from the first direction, and for exhausting mist in the first processing bath.

Another aspect of the substrate processing apparatus of the present invention for achieving the above technical object comprises a first processing bath and a second processing bath disposed adjacent to each other in a first direction; a first partition wall disposed between the first processing bath and the second processing bath and having an entrance, through which a substrate passes; a transfer unit installed in the first processing bath and the second processing bath and for moving the substrate; a chemical solution supply unit installed in the first processing bath and for providing a chemical solution to the substrate; and a first exhaust unit disposed between the first processing bath and the second processing bath and connected to the first partition wall, wherein the first exhaust unit includes a body elongated in a second direction different from the first direction, and a plurality of exhaust holes formed in the body, wherein the body includes a first side wall protruding than the first partition wall toward the first processing bath, in which the plurality of exhaust holes is formed, and a first connection wall connecting the first side wall and the first partition wall, wherein the first connection wall and the first partition wall form an obtuse angle.

Still another aspect of the substrate processing apparatus of the present invention for achieving the above technical object comprises a first processing bath and a second processing bath disposed adjacent to each other in a first direction; a first partition wall disposed between the first processing bath and the second processing bath and having an entrance, through which a substrate passes; a transfer unit installed in the first processing bath and the second processing bath and for moving the substrate; a chemical solution supply unit installed in the first processing bath and for providing a chemical solution to the substrate; and an L-shaped drop prevention structure installed in an upper portion of the entrance of the first partition wall and for receiving the chemical solution flowing down along the first partition wall.

One aspect of the substrate processing method of the present invention for achieving the above technical object comprises providing a substrate processing apparatus comprising a first processing bath and a second processing bath disposed adjacent to each other in a first direction, a first partition wall disposed between the first processing bath and the second processing bath, and having an entrance, through which a substrate passes, a first exhaust unit disposed between the first processing bath and the second processing bath and connected to the first partition wall, and an L-shaped drop prevention structure installed on the first partition wall, wherein the first exhaust unit includes a body elongated in a second direction different from the first direction, and a plurality of exhaust holes formed in the body, wherein the body includes a first side wall protruding than the first partition wall toward the first processing bath, and, and a first connection wall connecting the first side wall and the first partition wall, exhausting a chemical solution mist in the first processing bath through the plurality of exhaust holes, and flowing down a chemical solution attached to the first side wall along the first connection wall and the first partition wall to enter the drop prevention structure.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
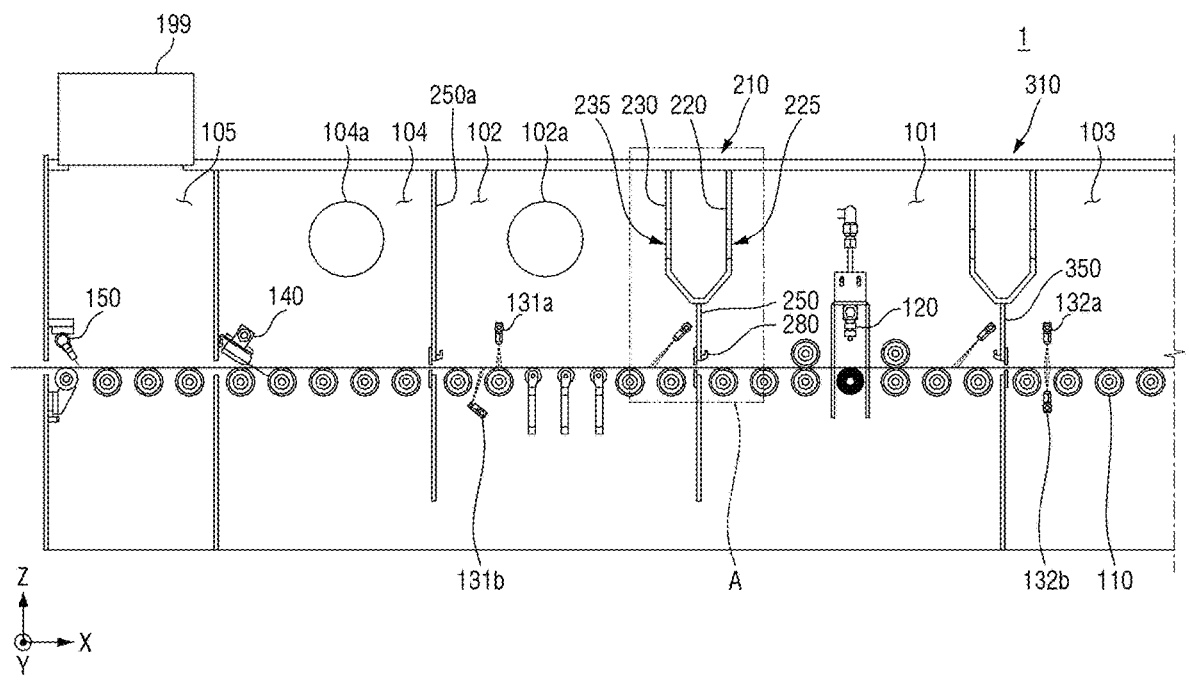
FIG. 1 is a view for describing a substrate processing apparatus according to a first embodiment of the present invention.

Hereinafter, preferred embodiments of the present disclosure will be described in detail with reference to the accompanying drawings. Advantages and features of the present disclosure and methods of achieving them will become apparent with reference to the embodiments described below in detail in conjunction with the accompanying drawings. However, the present disclosure is not limited to the embodiments described below, but may be implemented in various different forms, and these embodiments are provided only for making the description of the present disclosure complete and fully informing those skilled in the art to which the present disclosure pertains on the scope of the present disclosure, and the present disclosure is only defined by the scope of the claims. Like reference numerals refer to like elements throughout.

Spatially relative terms "below," "beneath," "lower," "above," and "upper" can be used to easily describe a correlation between an element or components and other elements or components. The spatially relative terms should be understood as terms including different orientations of the device during use or operation in addition to the orientation shown in the drawings. For example, when an element shown in the figures is turned over, an element described as "below" or "beneath" another element may be placed "above" the other element. Accordingly, the exemplary term "below" may include both directions below and above. The device may also be oriented in other orientations, and thus spatially relative terms may be interpreted according to orientation.

Although first, second, etc. are used to describe various elements, components, and/or sections, it should be understood that these elements, components, and/or sections are not limited by these terms. These terms are only used to distinguish one element, component, or section from another element, component, or section. Accordingly, the first element, the first component, or the first section mentioned below may be the second element, the second component, or the second section within the technical spirit of the present disclosure.

The terminology used herein is for the purpose of describing the embodiments and is not intended to limit the present disclosure. In the present disclosure, the singular also includes the plural, unless specifically stated otherwise in the phrase. As used herein, "comprises" and/or "comprising" refers to that components, steps, operations and/or elements mentioned does not exclude the presence or addition of one or more other components, steps, operations and/or elements.

Unless otherwise defined, all terms (including technical and scientific terms) used herein may be used with the meaning commonly understood by those of ordinary skill in the art to which the present invention belongs. In addition, terms defined in a commonly used dictionary are not to be interpreted ideally or excessively unless clearly defined in particular.

Hereinafter, embodiments of the present disclosure will be described in detail with reference to the accompanying drawings, and in the description with reference to the accompanying drawings, the same or corresponding components are given the same reference numbers, regardless of reference numerals in drawings, and an overlapped description therewith will be omitted.

Figure 2:
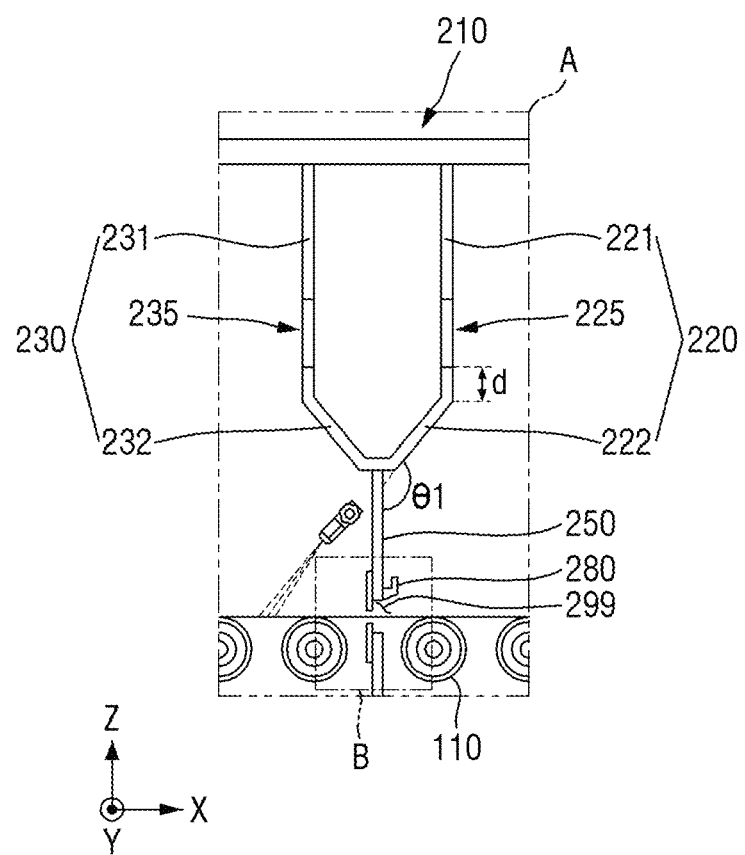
FIG. 2 is an enlarged view illustrating region A of FIG. 1.
Figure 3:
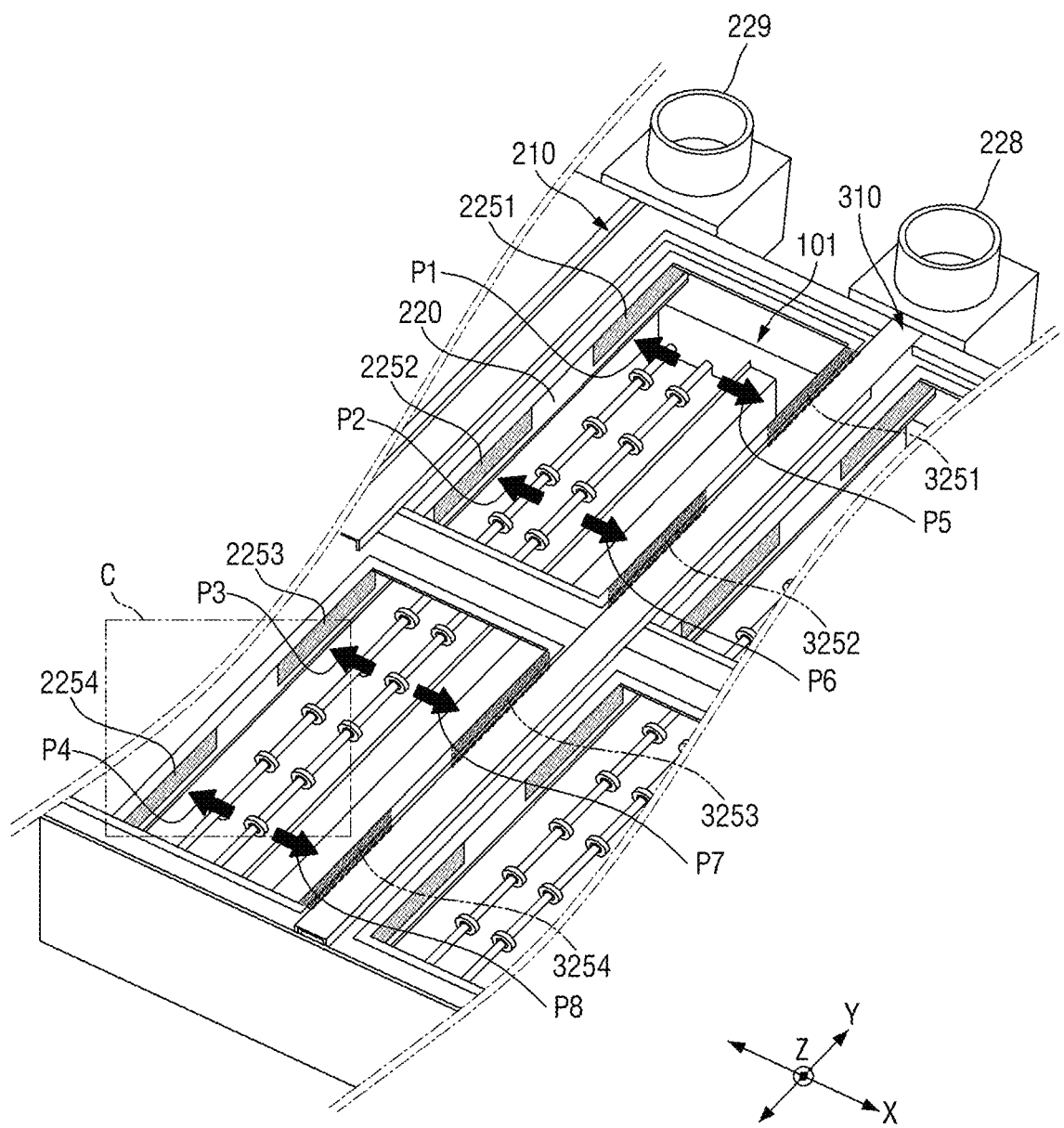
FIG. 3 is a perspective view for describing the relationship between the first processing bath, and the first exhaust unit and the second exhaust unit of FIG. 1.
Figure 4:
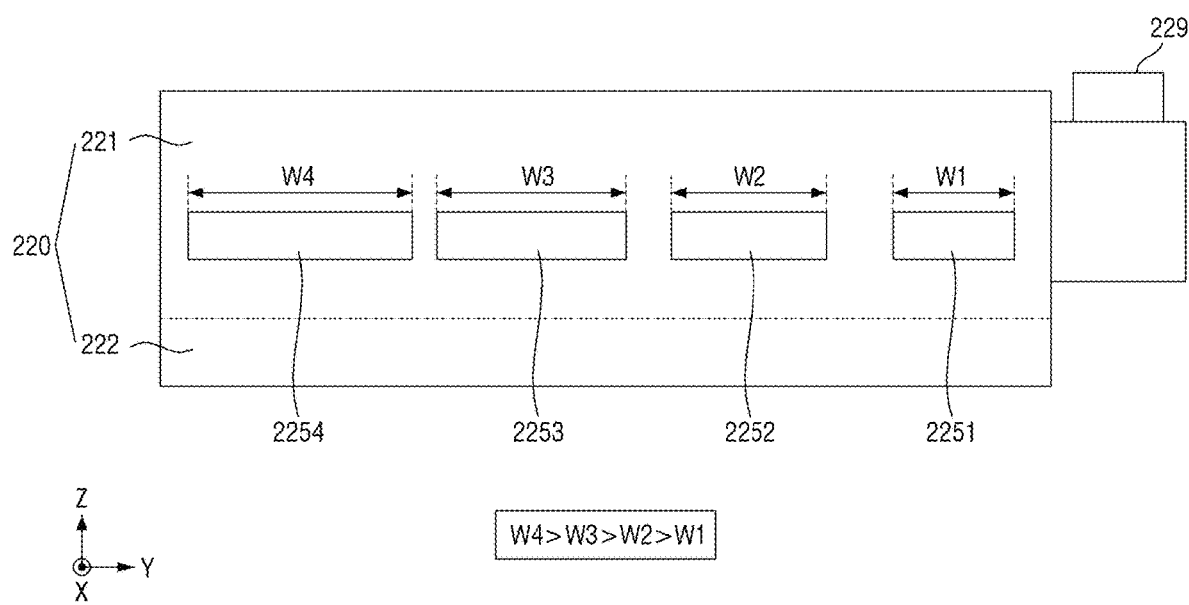
FIG. 4 is a front view for describing the structure of the first exhaust unit of FIG. 1.
Figure 5:
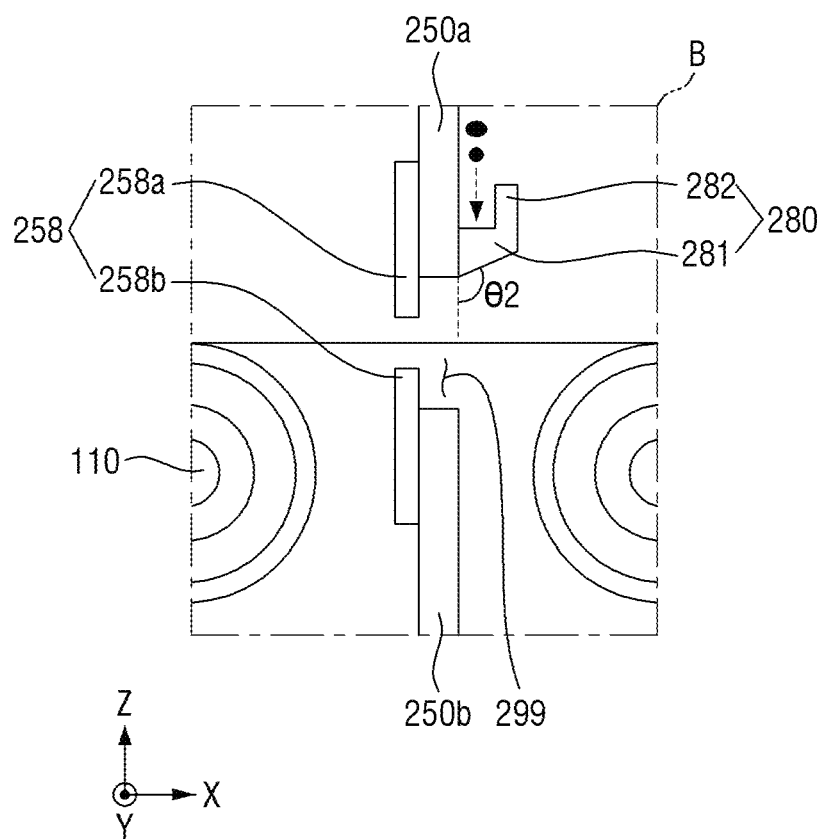
FIG. 5 is an enlarged view for describing region B of FIG. 2.
Figure 6:
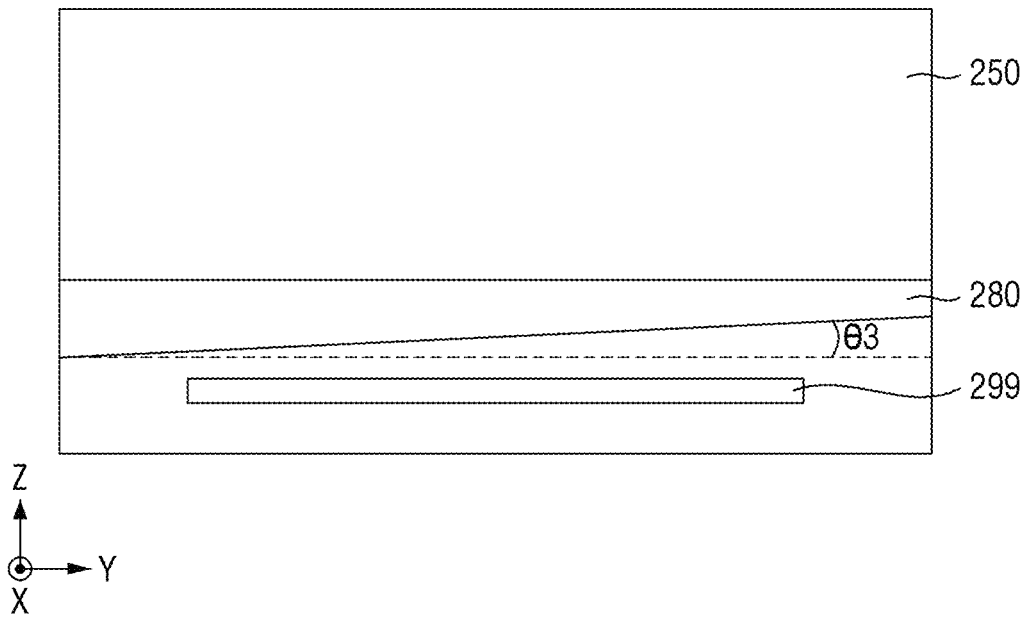
FIG. 6 is a front view for describing the drop prevention structure of FIG. 1.
Figure 7:
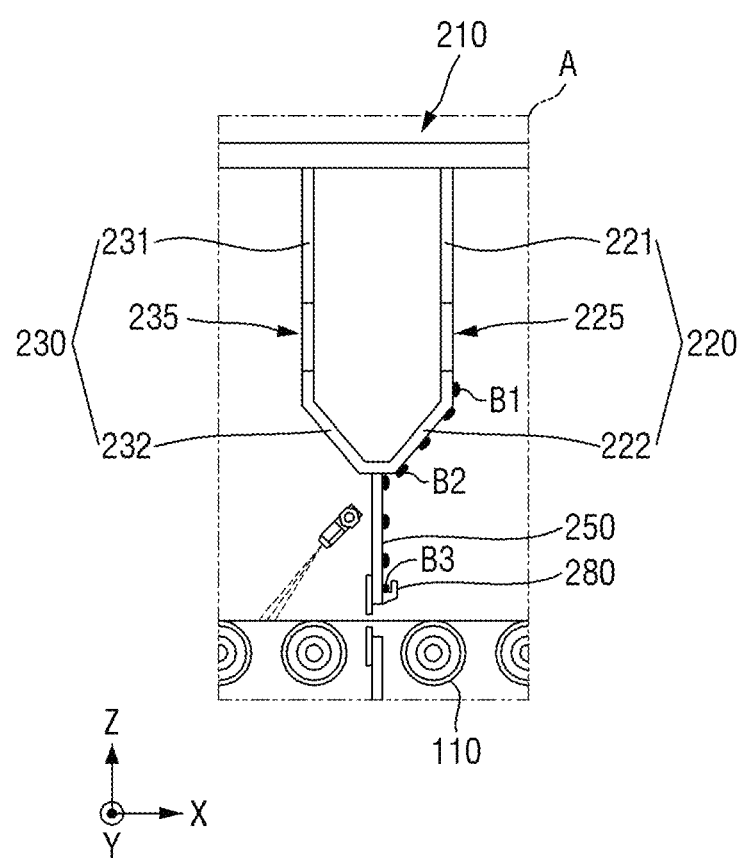
FIG. 7 is a view for describing the operation of the substrate processing apparatus according to the first embodiment of the present invention.

FIG. 1 is a view for describing a substrate processing apparatus according to a first embodiment of the present invention. FIG. 2 is an enlarged view illustrating region A of FIG. 1. FIG. 3 is a perspective view for describing the relationship between the first processing bath, the first exhaust unit and the second exhaust unit of FIG. 1. FIG. 4 is a front view for describing the structure of the first exhaust unit of FIG. 1. FIG. 5 is an enlarged view for describing region B of FIG. 2. FIG. 6 is a front view for describing the drop prevention structure of FIG. 1. FIG. 7 is a view for describing the operation of the substrate processing apparatus according to the first embodiment of the present invention.

Referring first to FIG. 1, the substrate processing apparatus 1 according to the first embodiment of the present invention includes a first processing bath 101, a second processing bath 102, a third processing bath 103, a fourth processing bath 104, a fifth processing bath 104, a transfer unit 110, a first chemical solution supply unit 120, a first exhaust unit 210, a second exhaust unit 310, and the like.

The fifth processing bath 105, the fourth processing bath 104, the second processing bath 102, the first processing bath 101, the third processing bath 103 may be disposed of this order being adjacent in the first direction X.

Partition walls 250, 350, and 250a are disposed between adjacent processing baths 101 to 105, and the processing baths 101 to 105 may be distinguished by the partition walls 250, 350 and 250a. For example, a first partition wall 250 is installed between the first processing bath 101 and the second processing bath 102, a second partition wall 350 is installed between the first processing bath 101 and the third processing bath 103, and a third partition wall 250a is installed between the second processing bath 102 and the fourth processing bath 104. An entrance (see 299 of FIG. 2), through which the substrate passes, is formed in the partition walls 250, 350, and 350a.

The transfer unit 110 is installed in the plurality of processing baths 101 to 105 to transfer the substrate. As shown, the transfer unit 110 includes rollers disposed at regular intervals, and each roller may be connected to a transfer shaft. The roller rotates according to the rotation of the transfer shaft, and the substrate may be transferred on the roller. The transfer unit 110 is not limited to a roller. For example, the transfer unit 110 may include an air floating system.

The first chemical solution supply unit 120 may be installed in the first processing bath 101 to supply the chemical solution to the substrate. The first chemical solution supply unit 120 may supply a chemical solution (e.g., deionized water) to the substrate with a strong pressure. The first chemical solution supply unit 120 may force the substrate with deionized water to remove particles present on the substrate.

The second chemical solution supply units 131*a* and 131*b* are installed in the second processing bath 102. The second chemical solution supply units 131*a* and 131*b* spray the chemical solution to the upper and lower surfaces of the substrate to maintain the substrate in a wet state.

Similarly, the third chemical solution supply units 132*a* and 132*b* are installed in the third processing bath 103 to spray the chemical solution to the upper and lower surfaces of the substrate.

The fourth chemical solution supply unit 140 is installed in the fourth processing bath 104 and pre-wets the substrate.

The air curtain 150 is installed at the entrance of the fifth processing bath 105 to block the space inside the processing baths 101 to 105 from the outside. A fan filter unit (FFU) 199 is installed on the ceiling of the fifth processing bath 105. A high-performance filter is installed in the fan filter unit 199 together with a fan to supply clean air into the processing baths 101 to 105.

An auxiliary exhaust hole 102*a* for removing mist in the second processing bath 102 is formed on one surface of the second processing bath 102. An auxiliary exhaust hole 104*a* for removing mist in the fourth processing bath 104 may be formed on one surface of the fourth processing bath 104.

Here, referring to FIGS. 1 and 2, the first exhaust unit 210 is disposed between the first processing bath 101 and the second processing bath 102, and is connected to the first partition wall 250.

The first exhaust unit 210 includes the bodies 220 and 230 installed long along the second direction Y, and includes an exhaust connection pipe (see 229 in FIG. 3) connected to one end of the bodies 220 and 230.

The bodies 220 and 230 include side walls 221 and 231 and connection walls 222 and 232, and an internal space is defined by the side walls 221 and 231 and the connection walls 222 and 232. The first side wall 221 protrudes than the first partition wall 250 toward the first processing bath 101. The second side wall 231 protrudes than the first partition wall 250 toward the second processing bath 102. The first connection wall 222 connects the first side wall 221 and the first partition wall 250, and the second connection wall 232 connects the second side wall 231 and the first partition wall 250.

An exhaust hole 225 is installed in the first side wall 221, and mist in the first processing bath 101 is sucked in through the exhaust hole 225. An exhaust hole 235 is also installed in the second side wall 231, and the mist in the second processing bath 102 is sucked in through the exhaust hole 235.

Also, an L-shaped drop prevention structure 280 is formed on the first partition wall 250. The drop prevention structure 280 receives the chemical solution flowing down along the first connection wall 222 and the first partition wall 250. The drop prevention structure 280 may be disposed in the upper side of the entrance 299 to prevent the chemical solution from falling onto the substrate passing through the entrance 299.

Here, referring to FIG. 5, the drop prevention structure 280 includes a pedestal 281 directly connected to the first partition wall 250, and a receiving wall 282 directly connected to the pedestal 281 for receiving a flowing chemical solution. As shown in FIG. 5, an angle θ2 between the pedestal 281 and the first partition wall 250 may be an obtuse angle. Even if the chemical solution is attached to the receiving wall 282, the chemical solution does not directly fall down, and flows down along the pedestal 281 having an obtuse angle. In this way, even if the chemical solution falls, the potential energy of the chemical solution can be minimized.

Here, referring to FIG. 6, the drop prevention structure 280 is elongated along the second direction Y, and the drop prevention structure 280 (in particular, the pedestal 281) is inclined (see angle θ3). As shown in FIG. 6, the angle θ3 between the extension direction of the drop prevention structure 280 (in particular, the pedestal 281) and the extension direction of the entrance 299 may be an acute angle. The chemical solution collected on the pedestal 281 may be removed to the outside of the first processing bath 101 along the inclined pedestal 281.

Referring back to FIG. 2, on the other hand, the angle θ1 between the first connection wall 222 and the first partition wall 250 may be an obtuse angle. This is to make it easier for the chemical solution to gather in the drop prevention structure 280 by flowing down the chemical solution attached to the first side wall 221 between the exhaust hole 225 and the first connection wall 222 along the first connection wall 222 and the first partition wall 250.

If the angle θ1 between the first connection wall 222 and the first partition wall 250 is not an obtuse angle, the chemical solution attached to the first side wall 221 may fall directly downward due to gravity. If the chemical solution falling in this way directly falls on the substrate, it may cause a defect.

Here, the distance d between the exhaust hole 225 and the first connection wall 222 may be greater than 1 mm and less than 10 mm. The distance d may be a distance between the lowermost edge of the exhaust hole 225 and the uppermost edge of the first connection wall 222. If the distance d is greater than 10 mm, the chemical solution attached to the first side wall 221 between the exhaust hole 225 and the first connection wall 222 does not flow along the first connection wall 222, but may directly fall downward by gravity. By minimizing the distance d, the chemical solution attached to the first sidewall 221 may be stably guided to the first connection wall 222. In addition, in order to stabilize the process of forming the exhaust hole 225 in the first side wall 221, the distance d is made greater than 1 mm.

Here, referring to FIGS. 3 and 4, the body 220 may be installed to be elongated in the second direction Y, and an exhaust connection pipe 229 may be installed at one end of the body 220. As shown, the exhaust connection pipe 229 and the body 220 do not overlap each other on a plane defined by the first direction X and the second direction Y.

A plurality of exhaust holes 2251, 2252, 2253, and 2254 are formed in the body 220 (or the first side wall 221). As illustrated, the first exhaust hole 2251, the second exhaust hole 2252, the third exhaust hole 2253, and the fourth exhaust hole 2254 may be sequentially disposed along the second direction Y.

The first exhaust hole 2251 may be closest to the exhaust connection pipe 229, and the fourth exhaust hole 2254 may be furthest from the exhaust connection pipe 229.

Through the first exhaust hole 2251, the second exhaust hole 2252, the third exhaust hole 2253, and the fourth exhaust hole 2254, the mist P1, P2, P3, P4 of the first processing bath 101 are sucked in. The mist entering the internal space of the bodies 220 and 230 is exhausted to the outside passing through the exhaust connection pipe 229.

Here, since the exhaust connection pipe 229 is biased toward one side, pressures in the plurality of exhaust holes 2251, 2252, 2253, and 2254 may be different. Accordingly, as the distance from the exhaust connection pipe 229 increases, the size of the exhaust holes 2251, 2252, 2253, and 2254 may increase in order to substantially equalize the pressures in the plurality of exhaust holes 2251, 2252, 2253, and 2254. For example, the size of the second exhaust hole 2252 may be greater than the size of the first exhaust hole 2251, the size of the third exhaust hole 2253 may be greater than the size of the second exhaust hole 2252, and the size of the fourth exhaust hole 2254 may be greater than the size of the third exhaust hole 2253.

If the exhaust holes 2251, 2252, 2253, and 2254 have the same height, the exhaust holes 2251, 2252, 2253, and 2254 may have different widths. That is, as the distance from the exhaust connection pipe 229 increases, the widths of the exhaust holes 2251, 2252, 2253, and 2254 may increase. For example, the width W2 of the second exhaust hole 2252 may be greater than the width W1 of the first exhaust hole 2251, the width W3 of the third exhaust hole 2253 may be greater than the width W2 of the second exhaust hole 2252, and the width W4 of the fourth exhaust hole 2254 may be greater than the width W3 of the third exhaust hole 2253.

Meanwhile, as described above, the second partition wall 350 is disposed between the first processing bath 101 and the third processing bath 103, and an entrance through which the substrate passes is formed.

The second exhaust unit 310 is disposed between the first processing bath 101 and the third processing bath 103, connected to the second partition wall 350, and includes a plurality of exhaust holes 3251, 3252, 323, and 3254 disposed along the second direction Y to exhaust the mists P5, P6, P7, and P8 in the first processing bath 101.

Here, referring to FIG. 5, a cover 258 capable of adjusting the size of the entrance 299 may be installed on the first partition wall 250.

The first partition wall 250 includes an upper partition wall 250a located in an upper portion and a lower partition wall 250b located in a lower portion with respect to the entrance 299. The cover 258 includes a first cover 258a installed on the upper partition wall 250a and a second cover 258b installed on the lower partition wall 250b.

Here, with reference to FIGS. 3 and 7, the operation of the substrate processing apparatus 1 according to the first embodiment of the present invention is summarized as follows.

Referring to FIGS. 3 and 7, the mist generated in the first processing bath 101 is sucked into the inner space of the body 210 through the plurality of exhaust holes 2251, 2252, 2253, 2254 of the first exhaust unit 210 installed on the front surface of the first side wall 221. It is exhausted to the outside through the exhaust connection pipe 229 along the inner space of the body 210.

In addition, the chemical solution B1 attached to the first side wall 221 moves along the first connection wall 222 (see the chemical solution B2), and moves along the first partition wall 250 to enter into the drop prevention structure 280 (see the chemical solution B3).

As described above, it is possible to minimize process defects by controlling the mist in the first processing bath 101.

Figure 8:
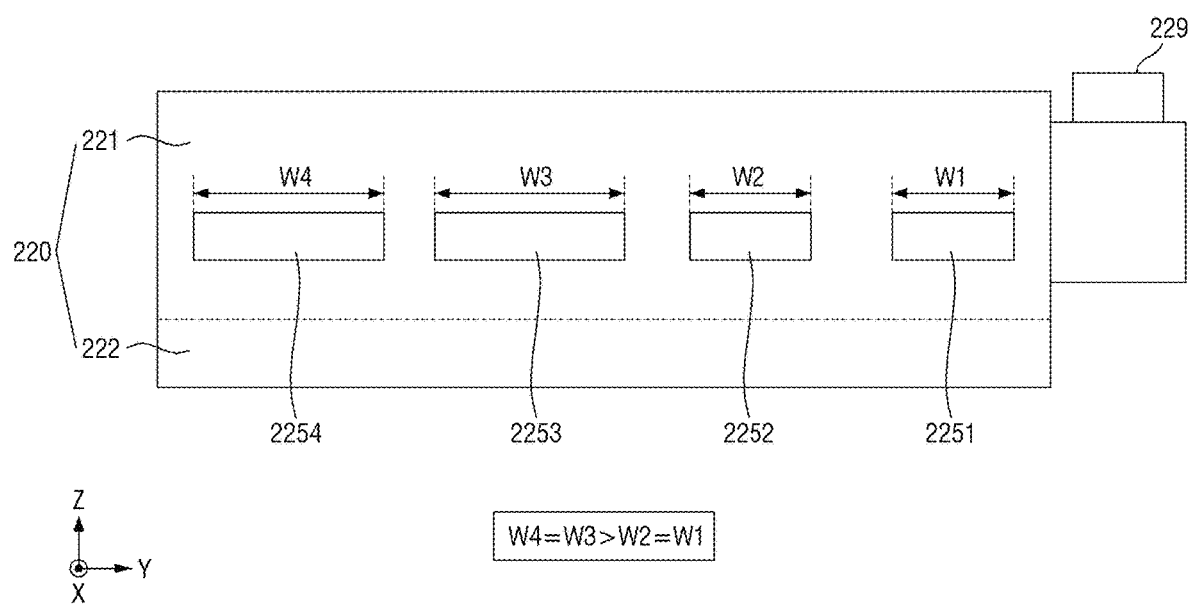
FIG. 8 is a view for describing a substrate processing apparatus according to a second embodiment of the present invention.

FIG. 8 is a view for describing a substrate processing apparatus according to a second embodiment of the present invention. For convenience of description, the points different from those described with reference to FIGS. 1 to 7 will be mainly described.

Referring to FIG. 8, in the substrate processing apparatus according to the second embodiment of the present invention, for example, the size of the second exhaust hole 2252 may be the same as the size of the first exhaust hole 2251, the size of the third exhaust hole 2253 may be greater than the size of the second exhaust hole 2252, and the size of the fourth exhaust hole 2254 may be the same as the size of the third exhaust hole 2253.

If the exhaust holes 2251, 2252, 2253, and 2254 have the same height, the widths of the exhaust holes 2251, 2252, 2253, and 2254 may be controlled differently. For example, the width W2 of the second exhaust hole 2252 may be the same as the width W1 of the first exhaust hole 2251, the width W3 of the third exhaust hole 2253 may be greater than the width W2 of the second exhaust hole 2252, and the width W4 of the fourth exhaust hole 2254 may be the same as the width W3 of the third exhaust hole 2253.

Figure 9:
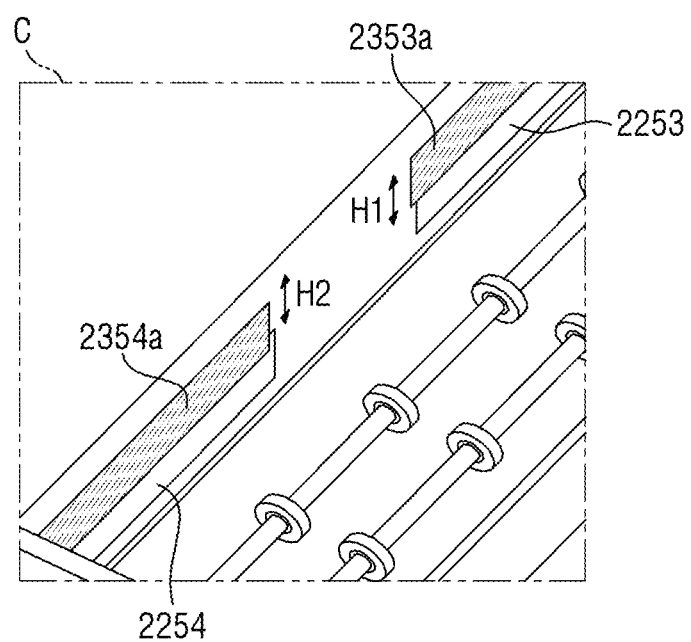
FIG. 9 is a view for describing a substrate processing apparatus according to a third embodiment of the present invention.

FIG. 9 is a view for describing a substrate processing apparatus according to a third embodiment of the present invention. For convenience of description, the points different from those described with reference to FIGS. 1 to 7 will be mainly described.

Referring to FIG. 9, in the substrate processing apparatus according to the third embodiment of the present invention, exhaust covers 2253a and 2254a for adjusting the size of the exhaust holes 2253 and 2254 may be installed on the first side wall.

By moving the exhaust covers 2253a and 2254a in one direction, the size of the exhaust holes 2253 and 2254 may be adjusted (see reference numerals H1 and H2). For example, the size of the exhaust holes 2253 and 2254 is adjusted by adjusting the exhaust covers 2253a and 2254a to substantially equalize the pressures in each of the exhaust holes 2253 and 2254.

Figure 10:
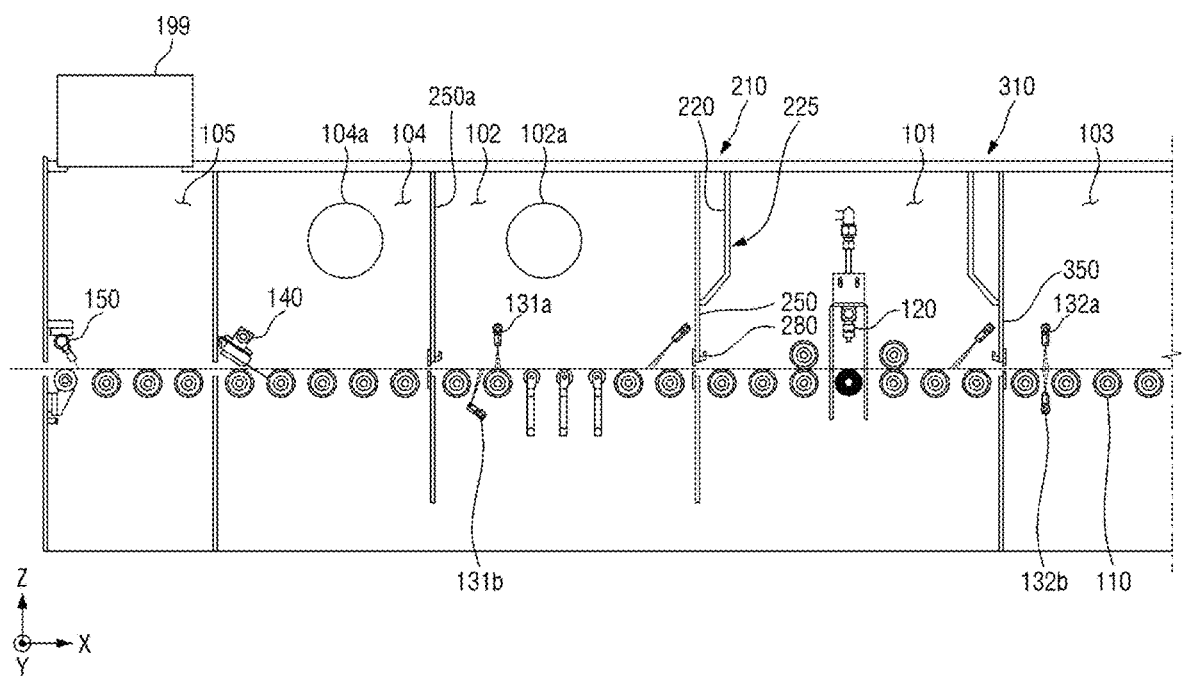
FIG. 10 is a view for describing a substrate processing apparatus according to a third embodiment of the present invention.

FIG. 10 is a view for describing a substrate processing apparatus according to a third embodiment of the present invention. For convenience of description, the points different from those described with reference to FIGS. 1 to 7 will be mainly described.

Referring to FIG. 10, in the substrate processing apparatus according to the third embodiment of the present invention, the first exhaust unit 210 is installed only on one side of the first partition wall 250, and mist generated in the first processing bath 101 is exhausted. The first exhaust unit 210 may not exhaust the mist generated in the second processing bath 102.

Similarly, the second exhaust unit 310 is installed only on one side of the second partition wall 350 to exhaust the mist generated in the first processing bath 101. The second exhaust unit 310 may not exhaust the mist generated in the third processing bath 103.

Figure 11:
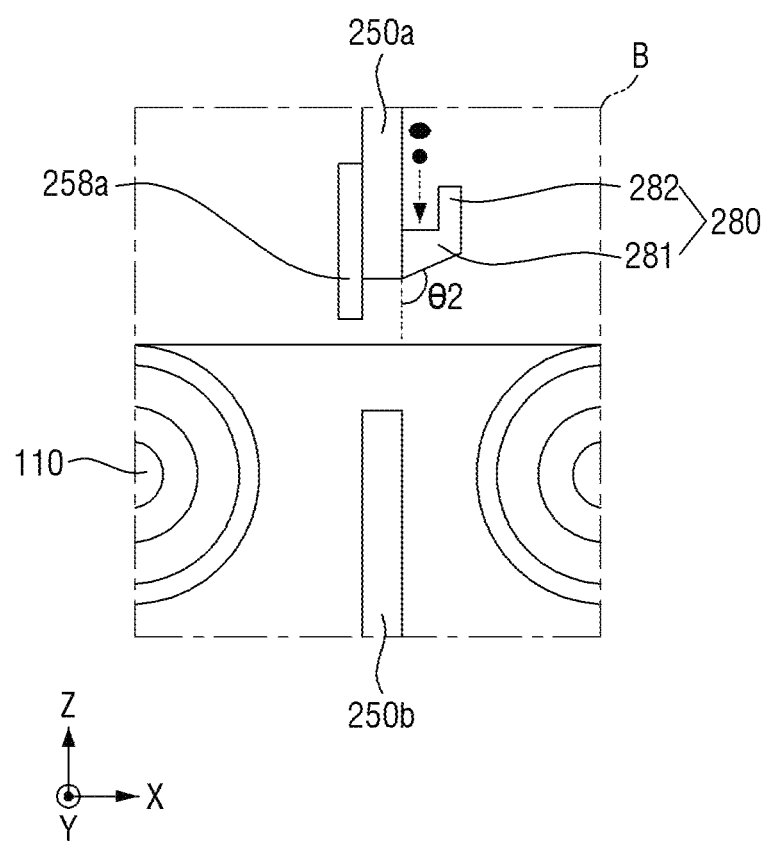
FIG. 11 is a view for describing a substrate processing apparatus according to a fourth embodiment of the present invention.

FIG. 11 is a view for describing a substrate processing apparatus according to a fourth embodiment of the present invention. For convenience of description, the points different from those described with reference to FIGS. 1 to 7 will be mainly described.

Referring to FIG. 11, in the substrate processing apparatus according to the fourth embodiment of the present invention, a cover 258a capable of adjusting the size of the entrance 299 may be installed on the first partition wall 250. The first partition wall 250 includes an upper partition wall 250a located in an upper portion and a lower partition wall 250b located in a lower portion with respect to the entrance 299. The cover 258a may be installed only on the upper partition wall 250a.

Although embodiments of the present invention have been described with reference to the above and the accompanying drawings, those skilled in the art, to which the present invention pertains, can understand that the present invention may be practiced in other specific forms without changing its technical spirit or essential features. Therefore, it should be understood that the embodiments described above are illustrative in all respects and not limiting.

What is claimed is:

1. An apparatus for processing a substrate comprising:
   a first processing bath and a second processing bath disposed adjacent to each other in a first direction;
   a first partition wall disposed between the first processing bath and the second processing bath and having an entrance, through which a substrate passes;
   a transfer unit installed in the first processing bath and the second processing bath and for moving the substrate;
   a chemical solution supply unit installed in the first processing bath and for providing a chemical solution to the substrate; and
   a first exhaust unit disposed between the first processing bath and the second processing bath, connected to the first partition wall, comprising a plurality of exhaust holes disposed along a second direction different from the first direction, and for exhausting mist in the first processing bath,
   wherein the first exhaust unit includes a first side wall protruding more than the first partition wall toward the first processing bath, and a first connection wall connecting the first side wall and the first partition wall,
   wherein the plurality of exhaust holes are installed in the first side wall.

2. The apparatus of claim 1, wherein the first exhaust unit includes a body installed elongated in the second direction, and an exhaust connection pipe connected to one end of the body,
   wherein the exhaust connection pipe and the body do not overlap each other on a plane defined by the first direction and the second direction.

3. The apparatus of claim 2, wherein the plurality of exhaust holes include a first exhaust hole and a second exhaust hole,
   wherein the first exhaust hole is closer to the exhaust connection pipe than the second exhaust hole, and a size of the second exhaust hole is greater than a size of the first exhaust hole.

4. The apparatus of claim 3, wherein a width of the second exhaust hole in the second direction is greater than a width of the first exhaust hole in the second direction.

5. The apparatus of claim 1, wherein the first exhaust unit further comprises a second side wall protruding than the first partition wall toward the second processing bath, and a second connection wall connecting the second side wall and the first partition wall,
   wherein a plurality of exhaust holes for exhausting mist in the second processing bath are installed in the second side wall.

6. The apparatus of claim 1, wherein the first connection wall and the first partition wall form an obtuse angle.

7. The apparatus of claim 1, wherein a distance between the exhaust hole and the first connection wall is greater than 1 mm and less than 10 mm.

8. The apparatus of claim 1, wherein an exhaust cover for adjusting a size of the exhaust hole is further installed on the first side wall.

9. The apparatus of claim 1, wherein the first partition wall includes an L-shaped drop prevention structure to receive a chemical solution flowing down along the first connection wall.

10. The apparatus of claim 9, wherein the drop prevention structure comprises a pedestal directly connected to the first partition wall, and a receiving wall directly connected to the pedestal for receiving the flowing down chemical solution,
    wherein the pedestal and the first partition wall form an obtuse angle.

11. The apparatus of claim 9, wherein the drop prevention structure is elongated in a second direction, and the pedestal is inclined.

12. The apparatus of claim 1 further comprises,
    a cover installed on the first partition wall for adjusting a size of the entrance.

13. The apparatus of claim 12, wherein the first partition wall includes an upper partition wall located in an upper portion with respect to the entrance and a lower partition wall located in a lower portion with respect to the entrance,
    wherein the cover includes a first cover installed on the upper partition wall, and a second cover installed on the lower partition wall.

14. The apparatus of claim 1 further comprises,
    an auxiliary exhaust hole disposed on one surface of the second processing bath.

15. The apparatus of claim 1 further comprises,
    a third processing bath, wherein the second processing bath, the first processing bath and the third processing bath are disposed in the order in the first direction;
    a second partition wall disposed between the first processing bath and the third processing bath and having an entrance, through which the substrate passes;
    a second exhaust unit disposed between the first processing bath and the third processing bath, connected to the second partition wall, comprising a plurality of exhaust holes disposed along a third direction different from the first direction, and for exhausting mist in the first processing bath.

16. An apparatus for processing a substrate comprising:
    a first processing bath and a second processing bath disposed adjacent to each other in a first direction;
    a first partition wall disposed between the first processing bath and the second processing bath and having an entrance, through which a substrate passes;
    a transfer unit installed in the first processing bath and the second processing bath and for moving the substrate;
    a chemical solution supply unit installed in the first processing bath and for providing a chemical solution to the substrate; and
    a first exhaust unit disposed between the first processing bath and the second processing bath and connected to the first partition wall,
    wherein the first exhaust unit includes a body elongated in a second direction different from the first direction, and a plurality of exhaust holes formed in the body,
    wherein the body includes a first side wall protruding more than the first partition wall toward the first processing bath, in which the plurality of exhaust holes is formed, and a first connection wall connecting the first side wall and the first partition wall,
    wherein the first connection wall and the first partition wall form an obtuse angle.

17. The apparatus of claim 16, wherein the first exhaust unit further comprises an exhaust connection pipe connected to one end of the body, wherein the plurality of exhaust holes includes a first exhaust hole and a second exhaust hole disposed along the second direction, wherein the first exhaust hole is closer to the exhaust connection pipe than the second exhaust hole, and a size of the second exhaust hole is greater than a size of the first exhaust hole.

18. The apparatus of claim 16, wherein the first partition wall includes an L-shaped drop prevention structure to receive a chemical solution flowing down along the first connection wall.

19. A method for processing a substrate comprising:

providing a substrate processing apparatus comprising a first processing bath and a second processing bath disposed adjacent to each other in a first direction, a first partition wall disposed between the first processing bath and the second processing bath, and having an entrance, through which a substrate passes, a first exhaust unit disposed between the first processing bath and the second processing bath and connected to the first partition wall, and an L-shaped drop prevention structure installed on the first partition wall, wherein the first exhaust unit includes a body elongated in a second direction different from the first direction, and a plurality of exhaust holes formed in the body, wherein the body includes a first side wall protruding more than the first partition wall toward the first processing bath, and a first connection wall connecting the first side wall and the first partition wall, exhausting a chemical solution mist in the first processing bath through the plurality of exhaust holes, and flowing down a chemical solution attached to the first side wall along the first connection wall and the first partition wall to enter the drop prevention structure.

\* \* \* \* \*